United States Patent [19]
Zetti

[11] Patent Number: 4,580,099
[45] Date of Patent: Apr. 1, 1986

[54] DEVICE FOR THE REMOTE DETECTION OF A FAILED LAMP IN A LIGHTING SYSTEM WITH A PLURALITY OF LAMPS CONNECTED IN PARALLEL

[76] Inventor: Gastone Zetti, Corso Giovanni Agnelli 42, Turin, 10137

[21] Appl. No.: 494,400

[22] Filed: May 13, 1983

[30] Foreign Application Priority Data

May 18, 1982 [IT] Italy .............................. 67650 A/82

[51] Int. Cl.[4] .............................................. G01R 31/24
[52] U.S. Cl. ................................ 324/414; 340/815.29
[58] Field of Search .................... 340/641, 642, 815.29, 340/635, 640; 315/159, 134; 324/133, 403, 405, 406, 414; 361/56, 91, 311

[56] References Cited

U.S. PATENT DOCUMENTS 2,548,818 4/1951 Rambo .................................. 361/91
3,541,504 11/1970 Bush .................................... 315/134
4,095,163 6/1978 Montague ............................ 361/56

*Primary Examiner*—Reinhard J. Eisenzopf
*Assistant Examiner*—Kevin D. O'Shea
*Attorney, Agent, or Firm*—McGlew and Tuttle

[57] ABSTRACT

The invention basically comprises: an isolating unit in series with the power line supplying the lamp, said isolating unit automatically disconnecting when the lamp is correctly supplied; a timer; a threshold comparator; a photodetector; a magnetic unit releasing a rod which carries a flag and is arranged to permanently connect a suitable resistance in parallel with the power line, upstream the isolating unit.

4 Claims, 6 Drawing Figures

DEVICE FOR THE REMOTE DETECTION OF A FAILED LAMP IN A LIGHTING SYSTEM WITH A PLURALITY OF LAMPS CONNECTED IN PARALLEL

The present invention relates to a device for the remote detection of a failed lamp in a lighting system with a plurality of lamps connected in parallel, the device being particularly suitable for the maintenance of street lighting.

At present the maintenance of the street lighting is based upon the direct observation by a maintenance team who goes along the streets after having turned on a given lighting section and checks the correct operation of that section. This procedure is expensive and scarcely effective, as periodic inspections separated by long time intervals are only possible.

The aim of the present invention is the remote detection of a failed lamp carried out from the supply station where the line supplying the lamp in a street section begins. By sending the information obtained through said remote detection towards an attended operation centre by means of known data transmission systems, the maintenance team is employed at the best and in short times, as it is sent to the concerned place only upon detection of a failure by the device.

For a better understanding reference is made to the accompanying drawings, in which.

Figure 1:
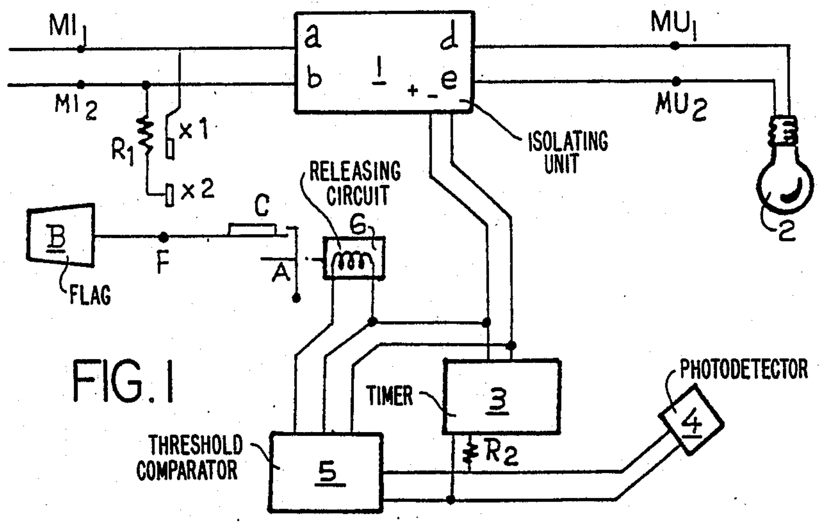
FIG. 1 is the electrical arrangement of the various blocks forming the device according to the invention.

As shown in FIG. 1, the the device of invention comprises the selfdisconnecting isolating unit 1 of which inputs a and b are connected to input terminals MI1, MI2, respectively, and outputs d, e are connected to output terminals MU1, MU2, respectively.

Input terminals MI1, MI2 are connected to the power line supplying lamp 2, which is connected to output terminals MU1, MU2.

Terminal MI1 is also connected to contact X1 and terminal MI2 is also connected to one end of resistor R1, the other end of which is connected to contact X2.

Unit 1 also has d.c. output terminals shown at +and −.

The "+" terminal is connected to timer 3, to one end of the coil of releasing unit 6 and to threshold comparator 5; the "−" terminal is connected to timer 3 and to threshold comparator 5. The other end of the coil of releasing circuit 6 is connected to the output of threshold comparator 5.

One end of resistor R2 is connected to timer 3, the other resistor end is connected to threshold comparator 5 and to photodetector 4. A second terminal of said photodetector 4 is directly connected to threshold comparator 5 and to timer 3.

Figure 3:
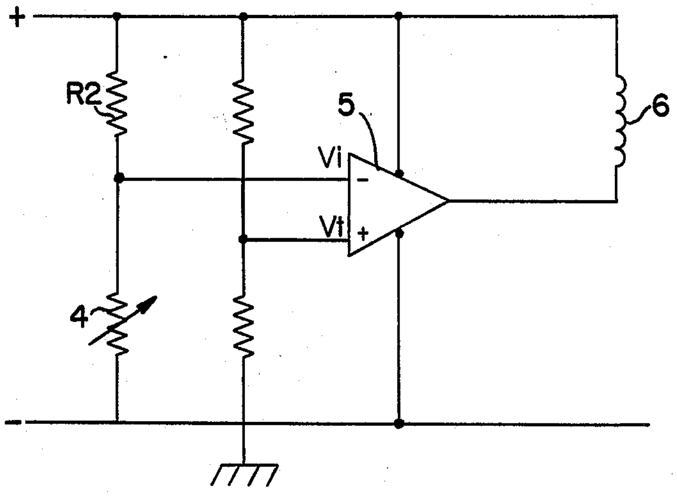
FIG. 3 shows the connections of threshold comparator to the other elements of FIG. 1.
Figure 6:
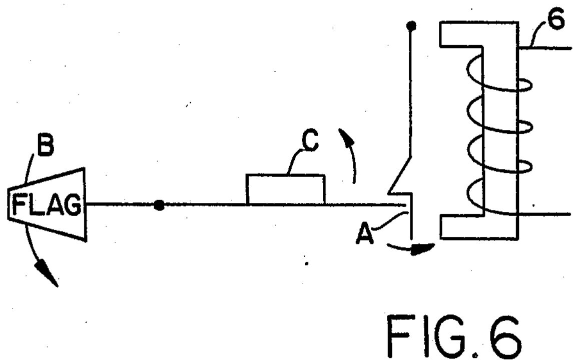
FIG. 6 is a schematic diagram of the releasing unit.

The details of threshold comparator and of its connections to the elements of FIG. 1 are shown in FIG. 3, where V denotes the voltage across + and − terminals of device 1 (the − terminal being assumed as ground), $V_t$ the threshold voltage, and Vi the voltage across photodetector. The diagram is that of commercially available comparator and needs no explanation Still referring to FIG. 1, A is the armature of releasing circuit 6; flag B connected to knife C through a flag-carrying rod which is rotatable about pivot F located between flag B and knife C and is kept horizontal, against the weight of flag B, by a projection of armature A as long as releasing circuit 6 is deenergized (see FIG. 6). Contacts X1 and X2 are shortcircuited by knife C when releasing circuit 6 is energized so that armature A no longer engages the rod which rotates about pivot F thereby moving knife C upwards and flag B downwards until they become vertically arranged.

Figure 2:
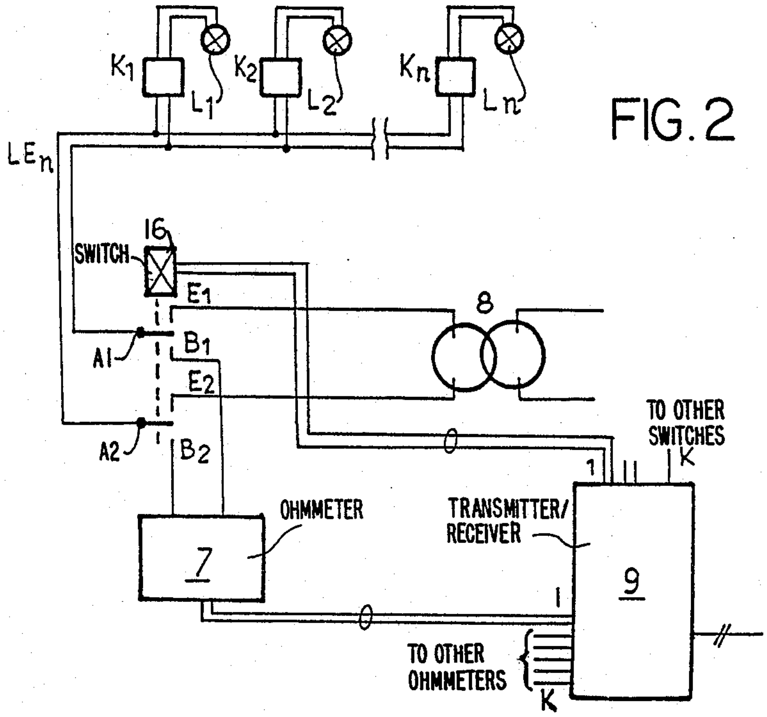
FIG. 2 shows a section of a lighting system with a plurality of lamps equipped with the device acccording to the invention, and with means for the remote detection of a failed lamp in the concerned section and means for the transmission of the detection result to the maintenance centre.

Referring now to FIG. 2, power line LEn supplies in parallel lamps L1, L2, . . . Ln of a street lighting section, each lamp being serially connected to a device K1, K2 . . . Kn for the remote detection of a failed lamp, like that disclosed in FIG. 1.

Power line LEn supplying a street lighting section, ends on change-over contacts A1, A2 of remote controlled switch 6; break contacts B1, B2 of said switch are connected to the two inputs of ohmmeter 7, whereas make contacts E1, E2 are connected to transformer 8 which supplies power line LEn with the required alternating current voltage when switch 16 is operated.

Ohmmeter 7 is also connected via two wires to device 9 for signal transmission to and control-signal reception from a remote location; device 9 can receive signallings (1 to K) from other ohmmeters. Remote-controlled switch 16 is connected via two wires to device 9 for signalling transmission to and control-signal reception from a remote location; other remote-controlled switches (1 to K) are connectable to said device 9. Device 9 is connected to said remote location via a telephone line.

Figure 4:
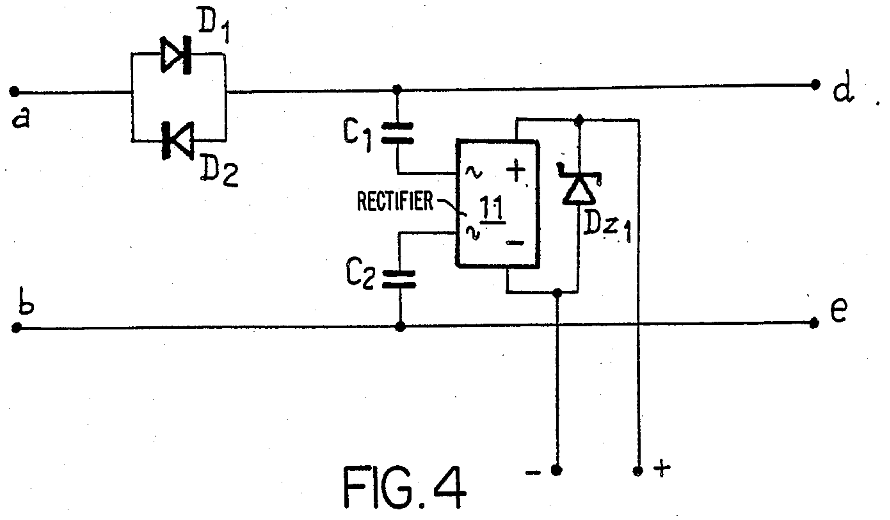
FIGS. 4 and 5 are two preferred embodiments of the self-disconnecting isolating unit to be connected in series between the power line and the lamp.

FIG. 4 shows a preferred embodiment of the self-disconnecting isolating unit. Referring to said Figure, input a is connected to output d through two diodes D1, D2 connected in antiparallel. Input b is directly connected to output e, which is also connected to one terminal of capacitor C2; output d is also connected to a terminal of capacitor C1, the other terminals of capacitors C1 and C2 being also connected to the a. c. inputs "v" of the rectifier bridge 11. The "+" and "−" terminals of said rectifier bridge are connected to cathode and anode, respectively, of Zener diode DZ1 and to the "+" and "−" outputs of said self-disconnecting line isolating unit.

Figure 5:
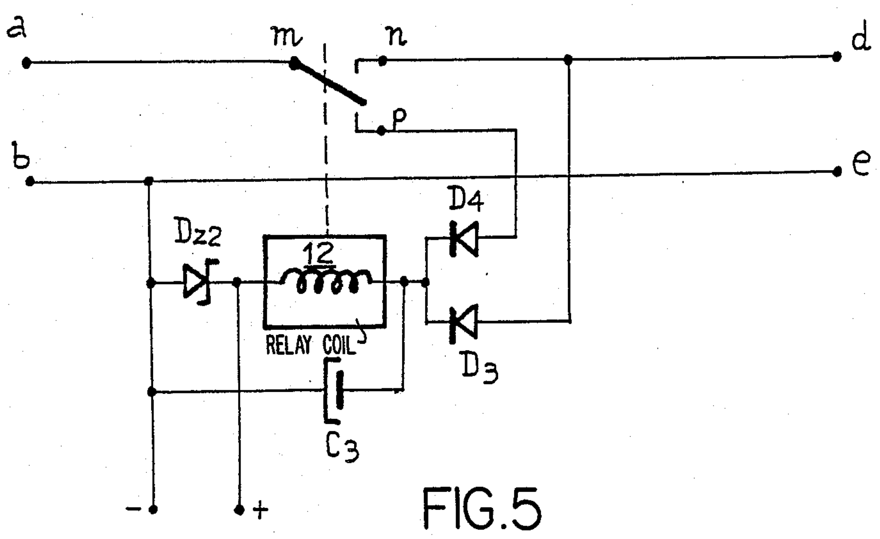

FIG. 5 shows a different embodiment of the self-disconnecting line isolating unit: referring to the Figure, input a is connected to change-over contact m, operated by relay 12, of a switch, the make contact n of which is connected to output d while break contact p is connected to the anode of diode D4.

Input b is connected to output e, to the anode of Zener diode DZ2, to capacitor C3 and to the "−" output of said self-disconnecting line isolating unit. The cathode of Zener diode DZ2 is connecting to one end of the coil of relay 12 and to the "+" output of the device; the other end of said coil of relay 12 is connected to the other terminal of capacitor C3 and to the cathode of diodes D3 and D4. The anode of D3 is connected to output d of said self-disconnecting line isolating unit.

The operation of the device for remote detection of a failed lamp according to the invention is as follows: referring to FIG. 1, when the 50 Hz a.c. supply voltage of the lamp is present at terminals MI1, MI2, the self-disconnecting line isolating unit is transparent to said voltage: in effect, if said unit is as shown in FIG. 4, diodes D1 and D2 do not present a sensible resistance to the current flow; if said unit is as shown in FIG. 5, relay 12 is immediately energized by the current flowing in the circuit "input a, contact m, contact p, diode D4, coil of relay 12, Zener diode DZ2, input b", and said relay is held even after change-over contact m is set on make contact n, as diode D3 replaces diode D4 to keep the current flow in said relay 12.

Therefore, the voltage present at the input terminals appears at terminals MU1 and MU2 to which the lamp is connected so tha lamp 2 normally lights up, no matter if it is of the incandescence or the discharge type.

The same line isolating unit provides a low d. c. supply voltage for timer 3 and threshold comparator 5. After a predetermined time of say a few minutes has elapsed (which time, is necessary for the lighting up of some kinds of lamps, for instance the sodium vapour lamps), the timer supplies the voltage divider consisting of resistor R2 and photodetector 4. Said photodetector may be a photoresistor or a phototransistor or any other device having a low resistance when it is illuminated, and a high resistance when it receives little or no light.

Across the photodetector a voltage will be present whose value is close to that of the voltage present at "+" and "−" terminals of device 1 if the lamp has not lit up, and is substantially zero if the lamp has correctly lit up.

This voltage is fed to threshold comparator 5 which compares it with the threshold voltage e.g. a voltage intermediate between +V and ground (see FIG. 3). With the arrangement shown in FIG. 3, the output voltage of threshold comparator is nearly 0 when the threshold is exceeded and is substantially voltage V in the opposite case.

Therefore: if the lamp has lit up, the two ends of the coil of releasing circuit 6 are at the same voltage V and no current flows in said coil; circuit 6 is not energized and flag B remains in place.

If the lamp has not lit up, a current flows in the coil circuit 6 which is is energized and causes armature A to be attracted, flag B to fall and contacts X1, X2 to become shortcircuited, thereby connecting resistor R1 across the line.

When at the morning of the subsequent day the lighting is turned off by deenergizing the remote controlled switch 16 (FIG. 3) through a control-signal received by device 9, via telephone line from the operating centre, the power line is switched from transformer 8 to to ohmmeter 7 which measures whether one or more resistors R1 are connected to the line. The resistance measurement is possible because, if the line isolating unit of FIG. 4 is used, the ohmmeter uses a d. c. voltage lower than the threshold voltage of diodes D1 and D2 to perform said resistance measurement and consequently the diodes isolate the line, for that low voltage, from the load formed by the individual lamps, whatever the polarity in respect of terminals MU1, MU2 may be.

If the line isolating unit of FIG. 5 is used, the ohmmeter may perform said resistance measurement by using a voltage as high as desidered, but terminal MI1 must receive a d. c. voltage with negative polarity with respect to terminal MI2.

If in the lighting section considered there is at least one failed lamp, the resistance measured by ohmmeter 7 is lower than a predetermined value; in this case ohmmeter 7 shortcircuits the two wires connecting it to device 9 for the signalling transmission to and control-signal reception from a remote location which device, if polled by the operating centre, transfers the information "at least one failed lamp" relative to the polled lighting section to said operating centre.

The maintenance staff can therefore timely reach the lighting section signalled and look at the lamp housing to intervene on the one(s) of which the alerting flag is down.

Upon replacement of the lamp, the maintenance staff will reset the device by moving flag B to its normal position and disconnecting therefore resistor R1 from the line.

All components of the device according to the present invention, shown in FIGS. 1, 4 and 5, are well known and commercially available; the novelty of the present invention is the provision of the self-disconnecting isolating unit in series with the lamp; said unit, in the absence of the a. c. voltage and with the proper cautions already described hereinbefore, allows the line to be isolated from the load formed by the lamps thereby allowing, by a simple measurement of resistance and with the lighting turned off, a measurement indicating "at least one failed lamp in the monitored section".

The invention has been described and shown with reference to two preferred embodiments and by suggesting some variants, but clearly in the pratice other changes and modifications are possible without departing from its scope.

I claim:

1. Device for the remote detection of a failed lamp in a lighting system with a plurality of lamps connected in parallel to a power line feeding the lamps with a voltage of predetermined characteristics supplied by an a.c. voltage source, the device comprising:

means associated with each lamp for isolating the lamp from the power line and comprising a pair of input terminals connected to the power line and a first pair of output terminals connected to the lamp, said isolating means supplying the lamp with the voltage present on the power line when said voltage has said predetermined characteristics, and isolating the lamp from the power line when the line voltage is different from the voltage with predetermined characteristics, said isolating means further comprising rectifying means emitting at a second pair of output terminals of the isolating means a low d.c. voltage proportional to the voltage present at input terminal;

a timer connected to said second pair of output terminals of the isolating means and emitting, after a predetermined time corresponding to the lamp lighting time, the voltage present across said second pair of output terminals of the isolating means;

a light sensitive element, fed with said low d.c. voltage through said timer and located so as to be illuminated by the lamp, said element supplying a voltage which is substantially zero when it is illuminated by the lamp and is substantially equal to the low d.c. voltage when it is not illuminated;

a threshold comparator, fed by said low d.c. voltage through the time and connected to the light sensitive element, said comparator emitting an output signal with a first voltage level when the output voltage of said light sensitive element is substantially zero and a second voltage level when the output voltage of said light sensitive element is substantially equal to the low d.c. voltage;

means for releasing a movable unit connected to the threshold comparator output and to an output terminal of said second pair of output terminals of the isolating means and operable to allow displacement of the movable unit from a first position to a second position when the comparator output voltage is at said second level, the movable unit being associated with a signalling device, arranged to indicate, in the second position of the movable unit, that the lamp has not lit up and with an electric contact that in said second position connects a predetermined resistance across the line, said predetermined resistance being manually disconnected when the failed lamp has been replaced;

resistance measuring means connected to a power line section common to a number of lamps of the lighting system, for the remote detection of the connection across the line section of at least a resistance, said resistance measuring means being operative after the disconnection of said line section from the a.c. source.

2. Device according to claim 1, wherein said means for electrically isolating the power line from the lamp array comprises two semiconductor diodes connected in antiparallel.

3. Device according to claim 1, wherein said means for electrically isolating the power line from the lamp comprises at least one change-over contact of at least one relay, said relay being self-energized and self-held by at least a diode in series with the relay coil so that in the absence of power supply the line is isolated in respect to at least one of the two polarities with which a voltage can be sent over said power line.

4. Device according to claim 1, wherein said resistance which is connected to the power line if the lamp has not lit up, is of reactive type.

* * * * *